United States Patent [19]

Bok

[11] Patent Number: 4,575,408

[45] Date of Patent: Mar. 11, 1986

[54] METHOD FOR FLOATING TRANSPORT OF SUBSTRATES

[76] Inventor: Edward Bok, Burg. Amersfoordtlaan 82, 1171 DR Badhoevedorp, Netherlands

[21] Appl. No.: 598,549

[22] PCT Filed: Aug. 23, 1983

[86] PCT No.: PCT/NL83/00031

§ 371 Date: Mar. 19, 1984

§ 102(e) Date: Mar. 19, 1984

[87] PCT Pub. No.: WO84/01084

PCT Pub. Date: Mar. 15, 1984

[30] Foreign Application Priority Data

Aug. 24, 1982 [NL] Netherlands ................. 8203318

[51] Int. Cl.[4] ............................................. C23C 15/00
[52] U.S. Cl. ................................. 204/192 E; 118/50.1; 118/715; 118/620; 118/718; 118/719; 118/720; 118/728; 156/345; 156/643; 156/646; 204/192 R; 204/298
[58] Field of Search ............... 204/298, 192 E, 192 R; 118/620, 50.1, 718, 719, 720, 715, 728; 406/12, 86, 88, 89; 156/345, 643, 646; 250/531

[56] References Cited

U.S. PATENT DOCUMENTS

| | | | |
|---|---|---|---|
| 3,731,823 | 5/1973 | Goth | 214/6 F |
| 3,904,506 | 9/1975 | Carmichael et al. | 204/298 |
| 4,081,201 | 3/1978 | Hassan et al. | 302/2 R |
| 4,109,157 | 8/1978 | Tanaka | 204/298 |
| 4,226,526 | 10/1980 | Spence-Gate | 355/53 |
| 4,278,366 | 7/1981 | Loveless et al. | 406/88 |
| 4,299,518 | 11/1981 | Whelan | 406/42 |
| 4,331,526 | 5/1982 | Kuehnle | 204/298 |

OTHER PUBLICATIONS

Musits et al. IBM Tech. Disc. Bull. 17(10) 1975 p. 2904.
Forslund IBM Tech. Disc. Bull. 13 (1970) pp. 39–40.

*Primary Examiner*—Arthur P. Demers
*Attorney, Agent, or Firm*—David H. Semmes; Warren E. Olsen

[57] ABSTRACT

Improved apparatus (10), including passage (22) for inter-cushion processing and transport of substrates (12) towards and from process modules (14) and (16) for main processing of said substrates (12) at non-atmospheric pressure in a series of successive process chambers (64), located in between successive processors/-transporters (66), in which secondary processing and transport of said substrates (12) take place.

13 Claims, 14 Drawing Figures

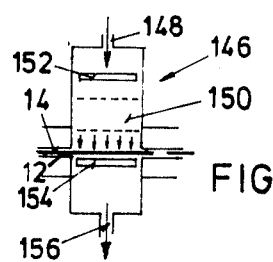
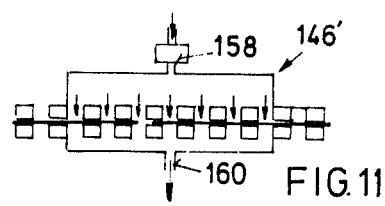
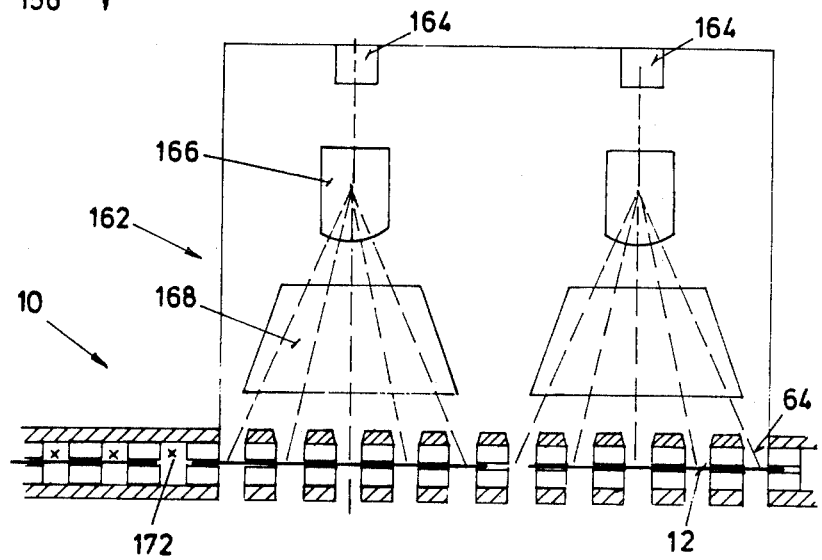
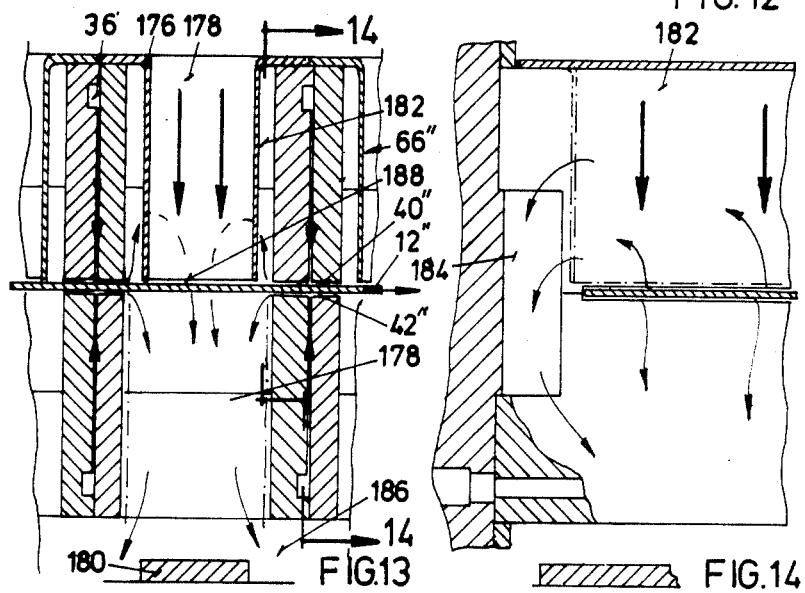

METHOD FOR FLOATING TRANSPORT OF SUBSTRATES

In the Dutch Patent Applications No's 8 103 979 and 8 200 753 of the applicant a transport system for substrates is disclosed, whereby these substrates are fed through a centrally positioned passage of a cabin and in that passage aside the substrate at least locally flowing gaseous medium establishes a floating transport of these substrates with at least almost no mechanical contact thereof with cabin components.

The apparatus according to the invention shows some improvements for the transport system towards and from particular modules, in which complicated processings under high vacuum take place and is mainly characterized by including means to at least locally establish an independent transport of the substrates by means of flowing gaseous medium, moving along these substrates.

A following positive characteristic is that the gaseous medium, fed towards such substrates, is splitted up in a main flow in direction of substrate movement towards a discharge and a secondary flow, moving in opposite direction towards another discharge and with a lower speed. Consequently, the resulting thrust of these flows on the substrate is in the direction of substrate movement.

Furthermore, the difference in speed of the flows is obtained by, as seen in direction of movement of the substrates, different widths of the transporter system segments with the smallest width in the direction of substrate movement.

The substrate might be a tape, which during the processing is indepently fed through the apparatus. Therefor, the text of this application is also applicable to such tapes.

The substrates have tolerances in thickness, flatness, roughness and bow. Consequently, with a constant width of the passage, both gap widths in between the substrates and the passage-wall sections of the transporter segments vary, resulting in a variable flowing speed of the gaseous medium, a variable thrust of the gaseous medium on the substrates and consequently a variable speed of the substrates.

The apparatus is now characterized, in that in the direction of substrate movement in between the transporter segment packages free areas are located for the positioning of sensors for regulation of the gaseous medium pressure in the passage depending upon on the quality of these substrates and the type of processing.

In the apparatus modules micro-wave oven drying, metallization, plasma etching, plasma stripping, plasma developing, ion implantation, oxidation, doping and other complicated processing may take place located chambers in between transporters and often together with a high vacuum. Therein the substrates are transported by a transport system, which is part of such modules.

A very positive characteristic is, that in direction of substrate movement the length of such processing chambers in between successive transporter segment packages is smaller than the length of the substrates, that the portion of the passage, located behind such chamber, provides a sufficient guidance for the substrates to correctly enter the passage in front of that chamber.

In particular "high current" ion implantation and micro-wave oven drying require a relatively long lasting processing.

An additional characteristic is, that in the direction of substrate movement a number of successive chambers with the same type of processing are used, with in between transporter segment packages and such packages are provided with a central passage for such substrates.

Due to the extremely low weight of the substrates per square inch, the pressure in the passages between successive module chambers can be very low and locally even near the high vacuum, which is used for such type of processing. Furthermore, in such a passage the same gaseous medium can be used as is required for the processing. Also, the processing module or cabin can be used as a common, wide discharge channel.

Furthermore, until now with high vacuum modules the supply and discharge of substrates accomplished by means of mechanical transport systems or cassettes of substrates are brought into these processing modules. This results in a loss of time, which is due to the reduction of the atmospheric pressure to high vacuum, whether or not through a load lock.

A following very positive characteristic of the present invention is that in the gaseous supply section of the transport system towards such a processing module the pressure of successive flows of gaseous medium drops incrementally per group of such flows towards at least close to the high vacuum.

Furthermore, in the discharge section of such a processing module the pressure increases upwardly from at least close to this high vacuum and incrementally higher per group of successive flows of gaseous medium. Thereby the many successive flows of gaseous medium in the direction of substrate movement establish, by means of numerous micro thrusts on such a substrate, a displacement thereof against the increasing pressure.

Furthermore, it is of importance, that the speed of the processing and consequently the speed of transport of the substrate during such processing remains as uniform as possible.

A following very positive characteristic of the apparatus is that thereby in front of and behind a series of processing modules of chambers the same type of gaseous medium is used in transport as in the processing module.

Furthermore, that thereby the length of such an arrangement of transporters is greater than half the length of the substrates.

As the transporters and processing modules use the same type of gaseous medium, such a quantity of cooling medium can be fed into such transporters and discharged therefrom, that during processing the temperature of the substrates remains below an acceptable value.

Further positive characteristics of the apparatus follow from the description of the following Figures:

FIG. 10 shows a processing module for plasma etching.

FIG. 11 is another module for such a plasma etching.

FIG. 12 is a longitudinal section of the apparatus at the location of a series of processing chambers of a module for ion implantation .

FIG. 13 is a fragmentary longitudinal section of such a module.

FIG. 14 is a fragmentary section, taken along line 14—14 of FIG. 13.

Figure 1:
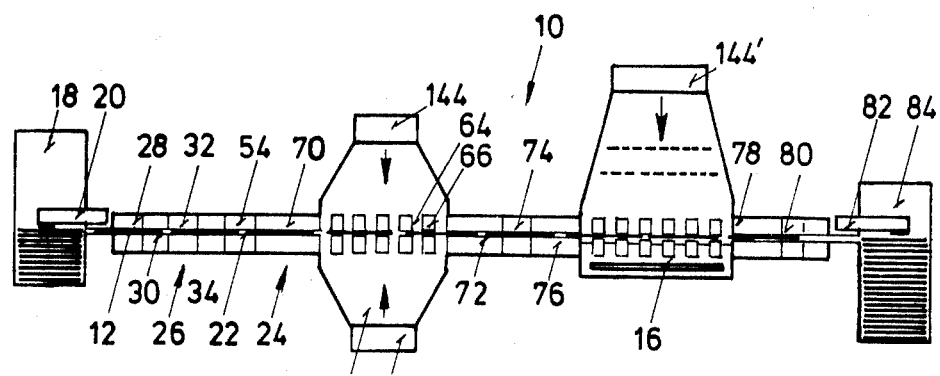
FIG. 1 shows in a simplified schematic configuration the apparatus according to the invention, including several processing modules.

In FIG. 1 apparatus 10 for processing of substrates 12 is shown. These substrates can also be a tape.

In this apparatus use is made of the process modules 14 and 16, and whereby by means of take-over device 20 the substrates 12 are transported from cassette 18 towards passage 22 of the transport section 24 for these modules.

Figure 3:
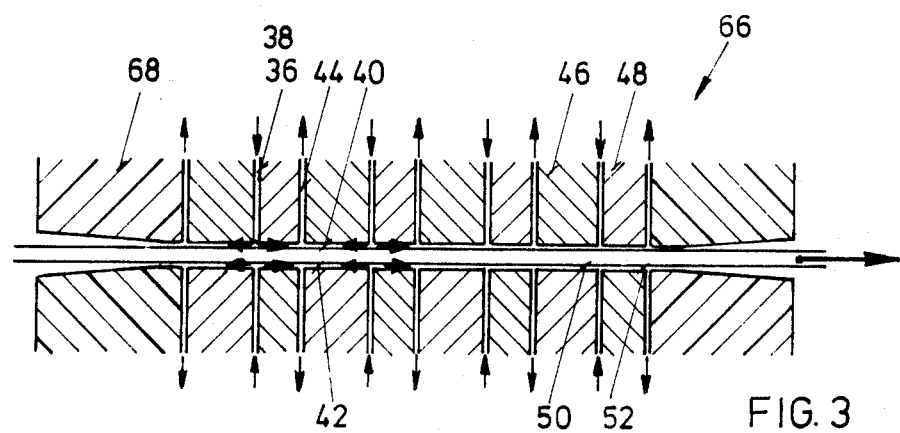
FIG. 3 is an enlarged fragmentary transverse section detail of the transport system in a module of the apparatus according to FIG. 1.

Thereafter a displacement of the substrates takes place by means of flows of gaseous medium, which is fed from segment packages 26 into the passage 22 and urged along these substrates 12, see also FIG. 3.

In this transport section 24 in the successive stations 28, 30, 32 and 34 also successively cleaning, drying, rinsing and again drying takes place. For this and other simple continuous processing the possible use of the process systems, is described in the Dutch Patent Applications No's 8 103 979 and 8 200 753 of the Applicant.

In FIG. 3 is shown, how also in or near these simple stations a transport of the substrates takes place regardless of processing medium.

Through supply channels 36 gaseous medium 38 is urged towards the passage gaps 40 and 42 aside the substrates and whereby a discharge of such medium takes place through discharge channels 44. The segment 46 has a larger width than segment 48, with consequently a larger flow restriction in gap 50 than in gap 52. As a result, in gap 52 the speed of the medium and therewith the force, applied on the substrate, is larger than that in gap 50 with a resulting force on the substrate in the direction of movement thereof. Due to the numerous flows of medium through successive series of channels a longitudinal displacement of the substrates is established.

In the module 14 processing under high vacuum takes place. For that purpose including transport section 54 in successive segment packages 56, 58, 60 and 62 gradually a drop in pressure of the transport medium occurs from near atmospheric pressure to near this high vacuum. Thereby use is made of supply- and discharge channels per segment package, wherein the pressure reduces per package. By means of a gradual increase of the flow restriction for the gaseous medium in the channels, located in such a package, the pressure in the gaps aside the substrates can also drop gradually.

The substrates are continuously fed through the module 14 while maintaining almost the same speed.

This module 14 consists of a great number of module chambers 64 with the transporters 66 positioned in between. Thereby these transporters 66 establish the displacement of the substrates through the module, whereby in the module chambers processing medium is urged towards such a substrate.

Figure 9:
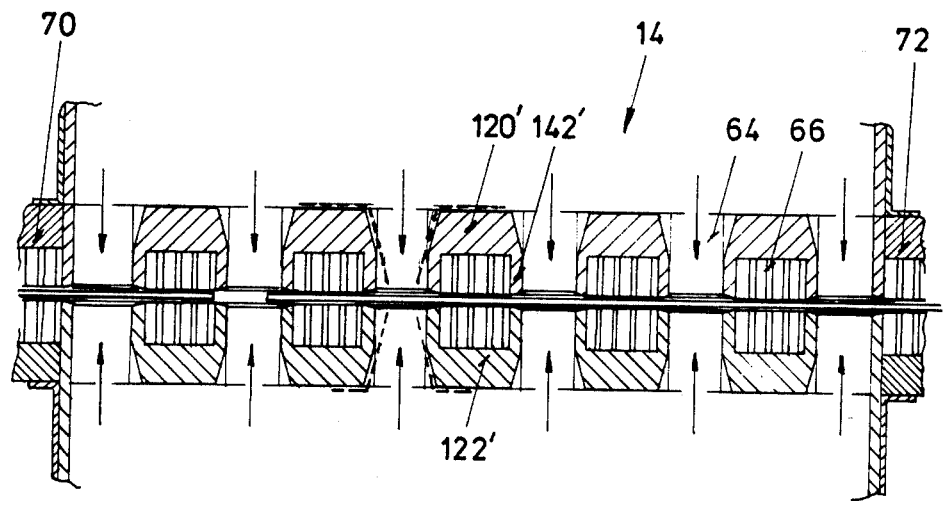
FIG. 9 is a longitudinal section of the apparatus according to FIG. 1 at the location of micro-wave oven modules.

The structure of these transporters 66 is for instance shown in FIGS. 3 and 9. Thereby at least the first segments of the package are inclined to enable a correct entering of the substrates.

The length of the processing module chambers in between these transporter segment packages is kept sufficiently small, that such a package provides sufficient guidance to the substate to pass through the following segment package without mechanical contact.

For a proper, even processing in this module 14 it is required, that the speed of the substrates through this module is constant, without being affected by the common, almost circular shape of the substrates. Therefor in the apparatus in front of this processing module 14 and behind it the respective transport stations 70 and 72 are located, in which the conditions of transport of the substrates are at least almost the same as those in the module. Thereby these transport stations can be provided with approximately the same segment packages 66 and the same areas 64 in between.

In cabin section 80, positioned in front of module 80, one or more simple basic processing steps can take place, after which the substrates by means of the take-over device 82 are transported towards cassette 84.

In FIGS. 4 through 9 the structure of apparatus 10 is disclosed. Thereby use is made of two bearers 86 an 88. In between these bearers successive segment packages 66 such as transporters for the substrates are potitioned so as to create passage 22. The notches 90 of segments 92, see also FIG. 6, rest in the corresponding grooves 94, positioned in the bearers 86 and 88, with a resulting precise width of the passage 22 for the substrates.

In segments 92 the main channel 96 is located, whereby a great number of branched channels 98 are connected therewith. The ends 100 of these channels 98 are in open connection with passage 22. In these channels 98 as supply channels the flow restriction for the gaseous medium is considerably larger than the restriction of the gap sections of the longitudinal passage aside the substrate. Consequently, even in the local absence of a substrate the flow of medium in the passage remains very limited.

By means of the mounting holes 102, located in these segments, and through which mounting means can be passed, a stacking of the segments is obtained under the creation of package 66.

The gaseous supply- and discharge channels are approximately the same. Thereby the entrances 104 of the supply channels are connected with the grooves 106 and 108, located in bearer 86, whereas these grooves, through supply channels 110 are connected with a discharge line not illustrated.

Covers 120 and 122, whether or not used per segment package, interconnect both bearers 86 and 88 while simultaneously enclosing the package. For that purpose bolt connections 124 and 126 are used.

Figure 7:
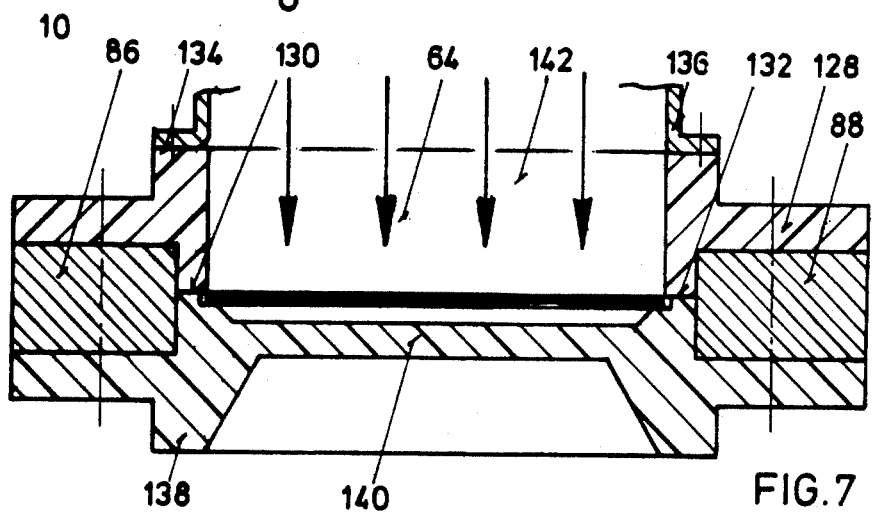
FIG. 7 is a transverse cross-section of a process chamber of a module.

In FIG. 7 the apparatus 10 is shown in a cross-section of the processing module 64. Thereby the distance between the bearers is to a small extent enlarged. The upper cover 128 is provided with wall sections 130 and 132, located at the inside of the bearers, whereas on the upper wall 134 thereof the cabin top 136 is mounted.

The lower cover 138 can be the same as the upper cover, if on both sides of the substrate the same processing takes place. If however only in the top section processing occurs, then lower cover 138 is provided with the bottom 140.

Both covers can be made of a material, which is suitable for processing, such as for a micro-wave oven material, which is micro-wave damping and for plasma, etching an electrical insulation material. Furthermore, such a cover 128 can contain inner transverse walls 142, through which the process chambers 64 are isolated.

In FIG. 9 the processing module 14 is shown in a more detailed configuration. Thereby both covers 120' and 122' of the segment packages 66' also contain the side walls 142' for the module chamber 64'.

Figure 2:
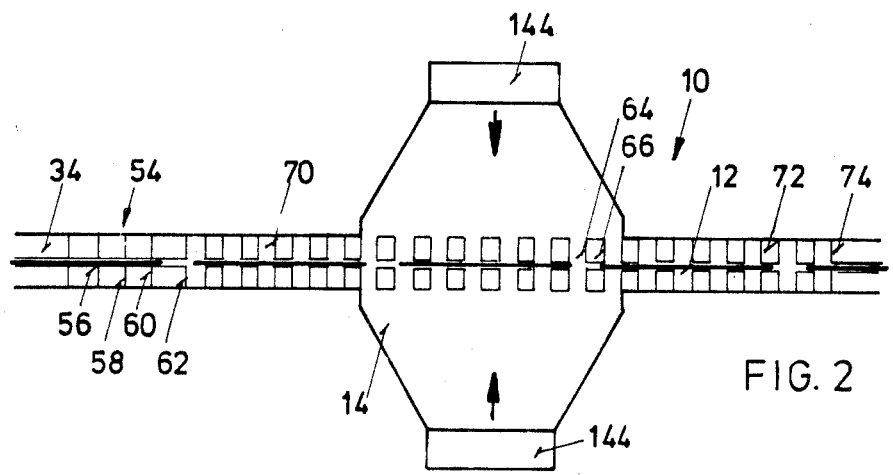
FIG. 2 shows the apparatus according to FIG. 1 in a more detailed form.

The processing module 14, as is shown in FIGS. 1 and 2, can be an oven, whereby in sections 144 thereof generators of micro-waves are located. These micro-waves may move from such generators through chamber 64 towards the substrates.

For this oven use can be made of micro-wave absorbent material to prevent as much as possible a heating of module components and in particular the segment packages. Thereby, dependent upon the type of oven and the transport speed of the substrates the number of chambers 64 can vary between a single one for simple processing and ten or more for complicated ovens for dehydration, with a total process time of 10-20 seconds.

In such generator sections 144 any other type of generator of processing medium can be positioned.

In FIG. 10 a plasma etch module 146 is shown in a simplified form, whereby through passage 148 gas is supplied and in section 150 plasma is generated, which under a high speed by means of electrode arrangements 152 and 154 is directed towards substrate 12. A discharge of gases takes place through passage 156.

In FIG. 11 another plasma etch module 146' is shown, whereby the generation of the plasma takes place outside within chamber 158 and the plasma under high speed is fed to the successive module chambers. Thereby through passage 160 a discharge of gases occurs.

In these designs on behalf of processing the modules can contain any type of scanning, such as magnetic, electro-static and even mechanic. Furthermore, during the processing the substrates 12 can make contact with electrode 154 and can, together with these electrodes, be connected with a grounding means of the module.

In FIG. 12 the module 162 for ion implantation is shown, whereby from generator 164 an ion beam is fed through divider 166 and a common scanning section 168, whereafter five split beams are fed to the module chambers. Here also, each type of scanning for divider 166 and section 168 is possible. Furthermore, a supplementary scanning is applicable. Also, such module can contain any type of electrical insulation, as required.

Furthermore, as two generators 164 are shown, within the scope of the invention this number of generators can vary between a single generator for all module chambers together and one generator per module chamber.

The module can also function as an etcher with the etching of the substrate surface by means of these ions.

Furthermore, on behalf of processing electrodes can be located in the module and the substrates can be electrically charged or grounded.

In another configuration of the processing modules metallization of the substrate surface can take place.

Furthermore, within the scope of the invention all other types of processing are applicable, as for instance modules for doping, oxidation of the substrate surface, modules to urge developing medium towards the substrates to develop the photo sensitive coating layer, applied thereon, modules for stripping of such layer and electron beam processing systems.

Figure 4:
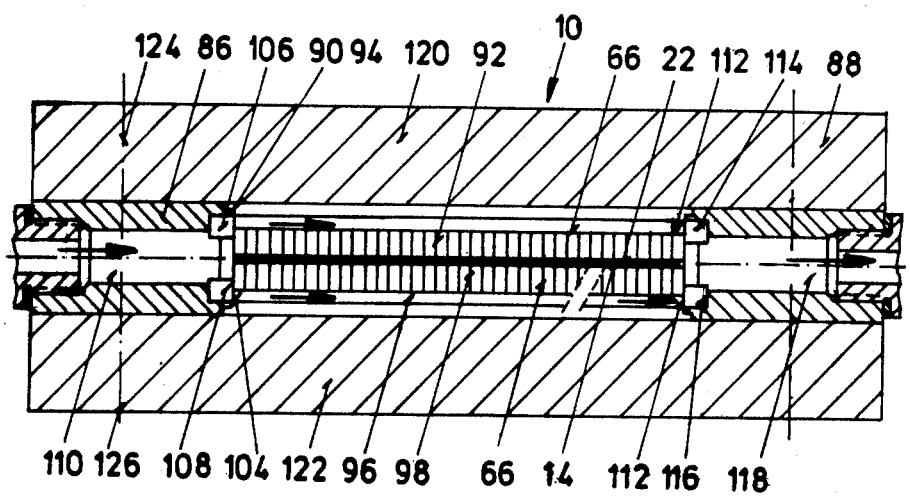
FIG. 4 is an enlarged longitudinal section of the apparatus according to FIG. 1 with the transporters, positioned therein.
Figures 5, 6:
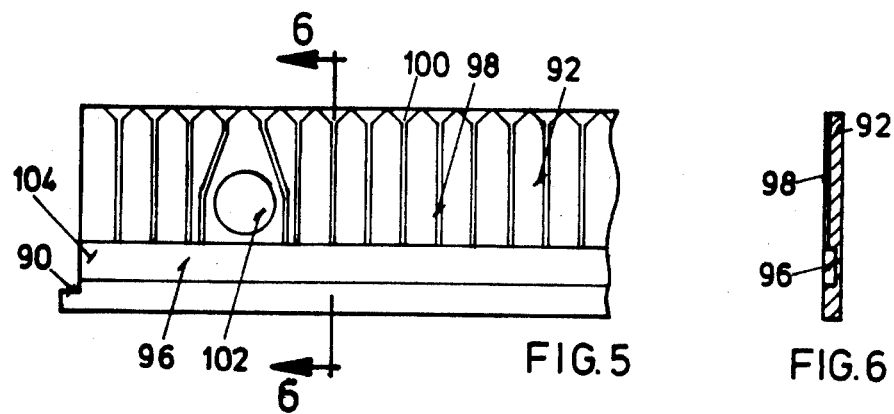
FIG. 5 is a fragmentary side view of a segment package of the transporters.
FIG. 6 is a cross-section taen along line 6—6 of the segments according to FIG. 5.

Also, by means of media, flowing through these segment packages, an in between cooling of the substrates can take place and to such an extent, that during processing the temperature of the substrate cannot rise too high. Thereby an efficient use can be made of the transport medium as cooling agent, as is shown in FIG. 4.

Figure 8:
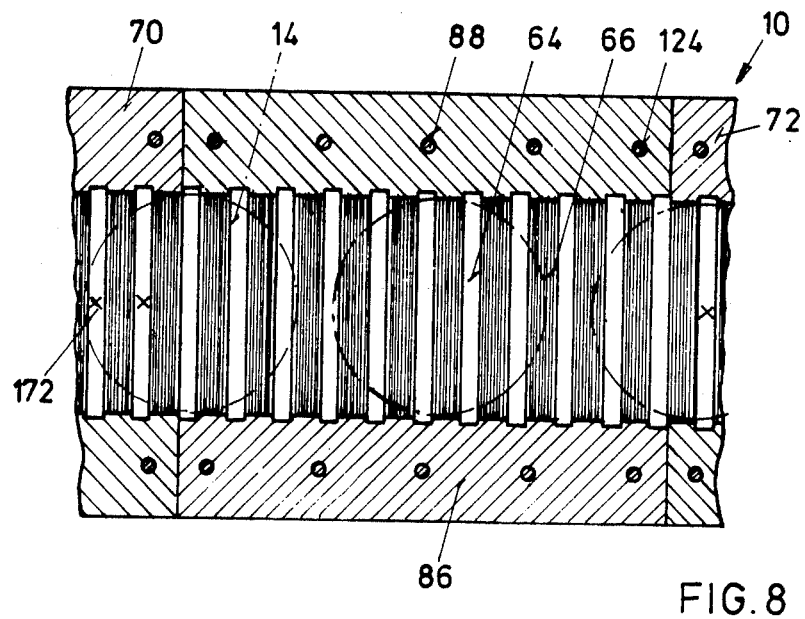
FIG. 8 is a top plan, partially in longitudinal section of the apparatus according to FIG. 1 at the location of a series of processing chambers.

Furthermore, in the apparatus 10 sensors 172 are located as a means for regulation of the transport speed of the substrates and with the use of the free areas in between successive segment packages, see FIGS. 8 and 12.

Furthermore, in these areas or somewhere else in the apparatus, instruments for measuring and testing and sensors to control the processing can be located.

As is shown, the substrates move through the apparatus separately from each other, with some distance in between. However, it is also possible, that these substrates adjoin each other in the direction of substrate movement.

Furthermore, a supply station can be part of a processing module, wherein a take-over device transports the supplied substrates towards a position in this module for processing. A second take-over device discharges these substrates to a receiving discharge station. Thereby a number of substrates can be brought to this processing position, whereby processing of these substrates takes place simultaneously.

FIGS. 13 and 14 show in detail a part of the transport system of a module, with an one-sided processing of the substrates, passing through. In such a module processing under an extremely high vacuum, as for instance lower than $1 \times 10^{-5}$ torr, takes place, whereby during certain types of processing, such as ion implantation and ion etching or ion milling to a great extent heat is supplied to the substrates.

However, by means of the gaseous medium, flowing through the segments and such eventually supplemented by cooling of these segments by such or another medium, a sufficient in between cooling of these substrates can be maintained.

In cover 174 the passage 176 is located, through which the processing medium and/or beams are directed towards substrates 12". The cover extends towards close to the substrate passage and whereby this passage is smaller than that of chamber 178, such that also with no substrate, being present, still a sufficient screening-off of the segment packages take place. Such also because of the possible use of electrodes 180, located underneath chamber 178, whereby processing medium, which is passed through this this chamber is attracted thereon. Furthermore, also in the chamber 178 aside the segment packages cover plates can be positioned.

The supply of the transport gases takes place through supply channel 36", with a vacuum pressure of for instance 1 torr as supply pressure. Thereby the floating of the substrates in the passage with the establishing of the gaps 40″ and 42″ is obtained by means of a lower supply pressure for the upper channels 36″ or the including of a larger flow restriction in these upper channels.

Gaseous transport medium is discharged from the gaps 40″ through discharge channels 182 between the cover 174 and the upper segment package 66″, cabin passage 184 aside the substrates 12″ and lower chamber 178 towards the cabin compartment 186. Thereby a high vacuum pump is connected with this compartment.

Furthermore, an immediate discharge of the transport gases from gap 41″ takes place through the chamber 178. Eventually, here also a cover can be used with discharge channels in between this cover and the lower packages.

The consumption of transport gas, which is also used for the processing, is very restricted. Consequently, with no substrate present in the processing area 188, these gases can still sufficiently be discharged by the vacuum pumps.

The segment packages and the processing chambers in between might have a length of approximately 3 mm in the direction of substrate movement. Consequently, per module the number of packages can be very large depending on the type of processing. Thereby an ideal in between cooling of the substrates can be maintained.

Within the scope of the invention other configurations of the modules are possible.

I claim:

1. Method for floating gaseous transport and processing of substrates and tape comprising:
   (a) introducing said substrates into an elongated transport and processing passage;
   (b) maintaining a pressurized source of gaseous transport medium in communication with said passage;
   (c) injecting said pressurized gaseous transport medium from above and below into said passage via a successive series of transversely aligned gaseous medium supply ports, while
   (d) simultaneously removing said gaseous transport medium via a series of transversely arrayed discharge ports intersecting said passage both before and behind each said series of gaseous medium supply ports; and
   (e) processing the moving substrates within said passage.

2. Method for floating gaseous transport and processing of substrates as in claim 1, wherein said gaseous transport medium supply ports and gaseous medium discharge ports are arranged successively in segment packages intersecting said passage and main processing is carried out intermediate said segment packages.

3. Method for floating gaseous transport and processing of substrates as in claim 2, wherein the discharge ports behind said supply ports provide a secondary flow of gaseous transport medium opposite to the direction of the moving substrate.

4. Method for floating gaseous transport and processing of substrates as in claim 1, including reducing the pressure of said gaseous transport medium in a pressure reduction module.

5. Method for floating gaseous transport and processing of substrates as in claim 2, wherein said main processing is conducted under a vacuum and within transporter segment discharge channels the pressure of said gaseous transport medium is dropped to near vacuum.

6. Method for floating gaseous transport and processing of substrates as in claim 5, including cooling by said gaseous transport medium in transporter segments subsequently of said main processing.

7. Method for floating gaseous transport and processing of substrates as in claim 6, including maintaining the temperature of said medium as secondary processing medium lower than the temperature of the surface of the substrate.

8. Method for floating gaseous transport and processing of substrates as in claim 7, wherein said main processing is from the group at least including microwave, electrostatic scanning, ion implantation, etching, and oxidation.

9. Method of floating gaseous transport and processing of substrates as in claim 8, wherein said processing is restricted to processing on one side of said substrate.

10. Method for floating gaseous transport and processing of substrates as in claim 8, including processing on both sides of said substrate.

11. Method for floating gaseous transport and processing of substrates as in claim 9, including maintaining the gaseous transport medium beneath said substrates at a greater pressure than the gaseous transport medium on top of said substrates.

12. Method for floating gaseous transport and processing of substrates as in claim 8, wherein said main processing is conducted under high vacuum.

13. Method for floating gaseous transport and processing of substrates as in claim 12, including removing of said main processing medium from (below said passage) processing chambers located between transporter segments.

* * * * *